US011727512B2

(12) United States Patent
Myers et al.

(10) Patent No.: US 11,727,512 B2
(45) Date of Patent: Aug. 15, 2023

(54) REAL ESTATE FIT AND BUDGETING TOOL AND METHOD

(71) Applicant: JONES LANG LASALLE IP, INC., Chicago, IL (US)

(72) Inventors: Wayne Myers, Chicago, IL (US); Ann Chambers, Chicago, IL (US); Paulette Saunders, Chicago, IL (US)

(73) Assignee: JONES LANG LASALLE IP, INC., Chicago, IL (US)

( * ) Notice: Subject to any disclaimer, the term of this patent is extended or adjusted under 35 U.S.C. 154(b) by 834 days.

(21) Appl. No.: 16/299,959

(22) Filed: Mar. 12, 2019

(65) Prior Publication Data

US 2019/0287192 A1    Sep. 19, 2019

Related U.S. Application Data

(60) Provisional application No. 62/643,552, filed on Mar. 15, 2018.

(51) Int. Cl.
| | |
|---|---|
| G06Q 50/16 | (2012.01) |
| G06Q 30/0645 | (2023.01) |
| G06Q 30/0601 | (2023.01) |
| G06F 3/0482 | (2013.01) |
| G06F 30/13 | (2020.01) |

(52) U.S. Cl.
CPC ......... G06Q 50/163 (2013.01); G06F 3/0482 (2013.01); G06F 30/13 (2020.01); G06Q 30/0629 (2013.01); G06Q 30/0643 (2013.01); G06Q 30/0645 (2013.01)

(58) Field of Classification Search
None
See application file for complete search history.

(56) References Cited

U.S. PATENT DOCUMENTS

2010/0010851 A1*  1/2010  Walker .............. G06Q 50/06
                                                                 705/315

OTHER PUBLICATIONS

"Office Space Calculator" (published on Nov. 30, 2017 by cubicles.com) https://www.cubicles.com/office-furniture-tools/office-space-calculator/.*
Office Space Calculator https://www.primmeroldsbas.co.uk/tool/space-calculator (published on Sep. 30, 2017).*

* cited by examiner

Primary Examiner — Rinna Yi
(74) Attorney, Agent, or Firm — Troutman Pepper Hamilton Sanders LLP (Rochester)

(57) ABSTRACT

A system for estimating space and budgeting requirements for real estate applications provides remote access to a user over a network so the user can receive real estate space and budgeting estimate in real time through a graphical user interface. A processor receives via a graphical user interface the user's select test fit parameters and the user's select property record of a subject property. The processor automatically generates a leasing cost estimate and a construction cost estimate based on the user's select test fit parameters and the user's select subject property record. The processor automatically generates a proposed layout of a floor plan based on the user's select test fit parameters and the user's select subject property record. The processor transmits the generated leasing cost estimate, the generated construction cost estimate, and the generated proposed layout of the floor plan for display in the graphical user interface.

39 Claims, 7 Drawing Sheets

← OFFICE SPACE CALCULATOR

| Head Count | Workplace Style | Construction Cost | | |
|---|---|---|---|---|
| | Moderate ▼ | Average ▼ | Save | Clear Calculator |

Office

Small — 100 SF — Qty: 0

10' x 12' — 120 SF — Qty: 0

12' x 15' — 180 SF — Qty: 0

Configure Custom Office

Workstation

6' x 6' — 36 SF — Qty: 100

Bench — 15 SF — Qty: 0

6' x 8' — 48 SF — Qty: 0

8' x 8' — 64 SF — Qty: 0

Configure Custom Workstations

Conference Rooms

REAL ESTATE FIT AND BUDGETING TOOL AND METHOD

This application claims priority to U.S. Provisional Patent Application No. 62/643,552, filed Mar. 15, 2018, which is hereby incorporated by reference herein in its entirety as if fully set forth below.

FIELD

This disclosure is directed to software tools for real estate applications. More specifically, the disclosure is directed to a method and software tool for estimating space and budgeting requirements for real estate applications.

BACKGROUND

Real estate brokerages compete to provide faster, more accurate estimates for their clients to select properties for leasing/purchasing. Many factors affect the cost to a particular client for a particular property. A tool is needed to help brokers provide fast, accurate estimates and visualizations for clients to compare properties under consideration.

DETAILED DESCRIPTION

To facilitate an understanding of the principals and features of the disclosed technology, illustrative embodiments are explained below. The components described hereinafter as making up various elements of the disclosed technology are intended to be illustrative and not restrictive. Many suitable components that would perform the same or similar functions as components described herein are intended to be embraced within the scope of the disclosed electronic devices and methods. Such other components not described herein may include, but are not limited to, for example, components developed after development of the disclosed technology.

It must also be noted that, as used in the specification and the appended claims, the singular forms "a," "an" and "the" include plural releases unless the context clearly dictates otherwise.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

Figure 1:
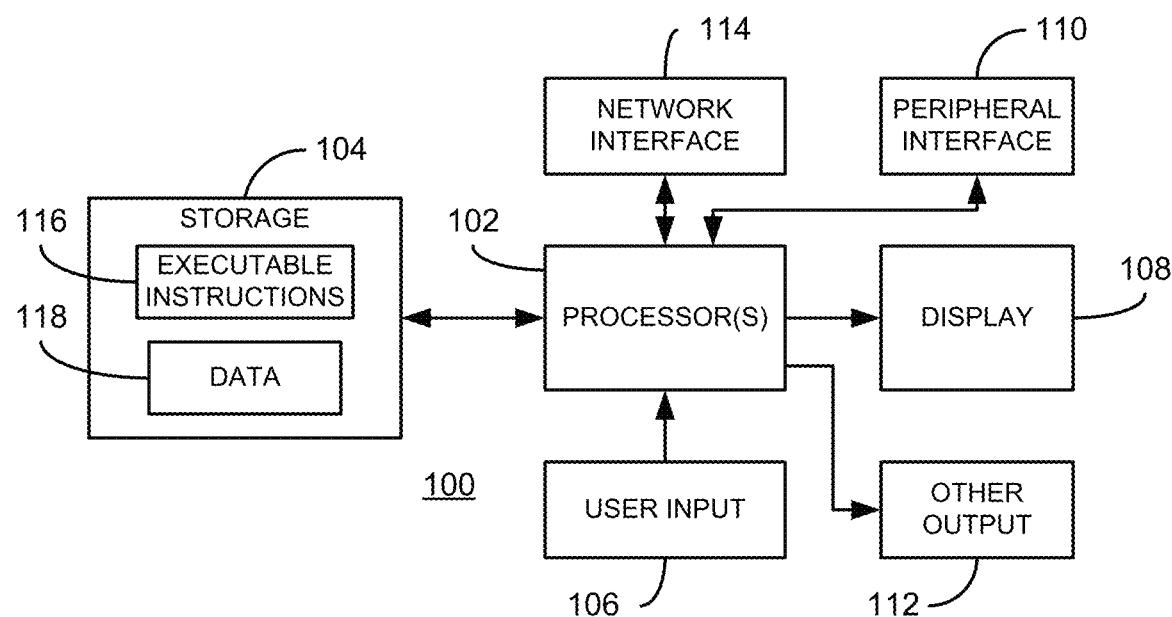
FIG. 1 is a block diagram of a computing device for use with the disclosure illustrating the relationship between functional components, in accordance with the present disclosure.

Referring now to the Figures, in which like reference numerals represent like parts, various embodiments of the computing devices and methods will be disclosed in detail. FIG. 1 is a block diagram illustrating one example of a computing device 100 suitable for use in generating visually integrated real estate data.

FIG. 1 illustrates a representative computing device 100 that may be used to implement the teachings of the instant disclosure. The device 100 may be used to implement, for example, one or more components of the system shown in FIG. 4, as described in greater detail below. As another example, the device 100 may be used to implement the methods of FIG. 2 or FIG. 3, as described in greater detail below. The device 100 includes one or more processors 102 operatively connected to a storage component 104. The storage component 104, in turn, includes stored executable instructions 116 and data 118. In an embodiment, the processor(s) 102 may include one or more of a microprocessor, microcontroller, digital signal processor, co-processor or the like or combinations thereof capable of executing the stored instructions 116 and operating upon the stored data 118. Likewise, the storage component 104 may include one or more devices such as volatile or nonvolatile memory including but not limited to random access memory (RAM) or read only memory (ROM). Further still, the storage component 104 may be embodied in a variety of forms, such as a hard drive, optical disc drive, floppy disc drive, flash memory, etc. Processor and storage arrangements of the types illustrated in FIG. 1 are well known to those having ordinary skill in the art. In one embodiment, the processing techniques described herein are implemented as a combination of executable instructions and data within the storage component 104.

As shown, the computing device 100 may include one or more user input devices 106, a display 108, a peripheral interface 110, other output devices 112, and a network interface 114 in communication with the processor(s) 102. The user input device 106 may include any mechanism for providing user input to the processor(s) 102. For example, the user input device 106 may include a keyboard, a mouse, a touch screen, microphone and suitable voice recognition application, or any other means whereby a user of the device 100 may provide input data to the processor(s) 102. The display 108 may include any conventional display mechanism such as a cathode ray tube (CRT), flat panel display, projector, or any other display mechanism known to those having ordinary skill in the art. In an embodiment, the display 108, in conjunction with suitable stored instructions 116, may be used to implement a graphical user interface. Implementation of a graphical user interface in this manner is well known to those having ordinary skill in the art. The peripheral interface 110 may include the hardware, firmware and/or software necessary for communication with various peripheral devices, such as media drives (e.g., magnetic disk, solid state, or optical disk drives), other processing devices, or any other input source used in connection with the instant techniques. For example, the peripheral interface may be a Universal Serial Bus (USB). Likewise, the other output device(s) 112 may optionally include similar media drive mechanisms, other processing devices, or other output destinations capable of providing information to a user of the device 100, such as speakers, LEDs, tactile outputs, etc. Finally, the network interface 114 may include hardware, firmware, and/or software that allows the processor(s) 102 to communicate with other devices via wired or wireless networks, whether local or wide area, private or public, as known in the art. For example, such networks may include the World Wide Web or Internet, or private enterprise networks, as known in the art.

While the computing device 100 has been described as one form for implementing the techniques described herein, those having ordinary skill in the art will appreciate that other, functionally equivalent techniques may be employed. For example, as known in the art, some or all of the functionality implemented via executable instructions may also be implemented using firmware and/or hardware devices such as application specific integrated circuits (ASICs), programmable logic arrays, state machines, etc. Furthermore, other implementations of the device 100 may include a greater or lesser number of components than those illustrated. Once again, those of ordinary skill in the art will appreciate the wide number of variations that may be used is this manner. Further still, although a single computing device 100 is illustrated in FIG. 1, it is understood that a combination of such computing devices may be configured to operate in conjunction (for example, using known networking techniques) to implement the teachings of the instant disclosure.

Figure 2:
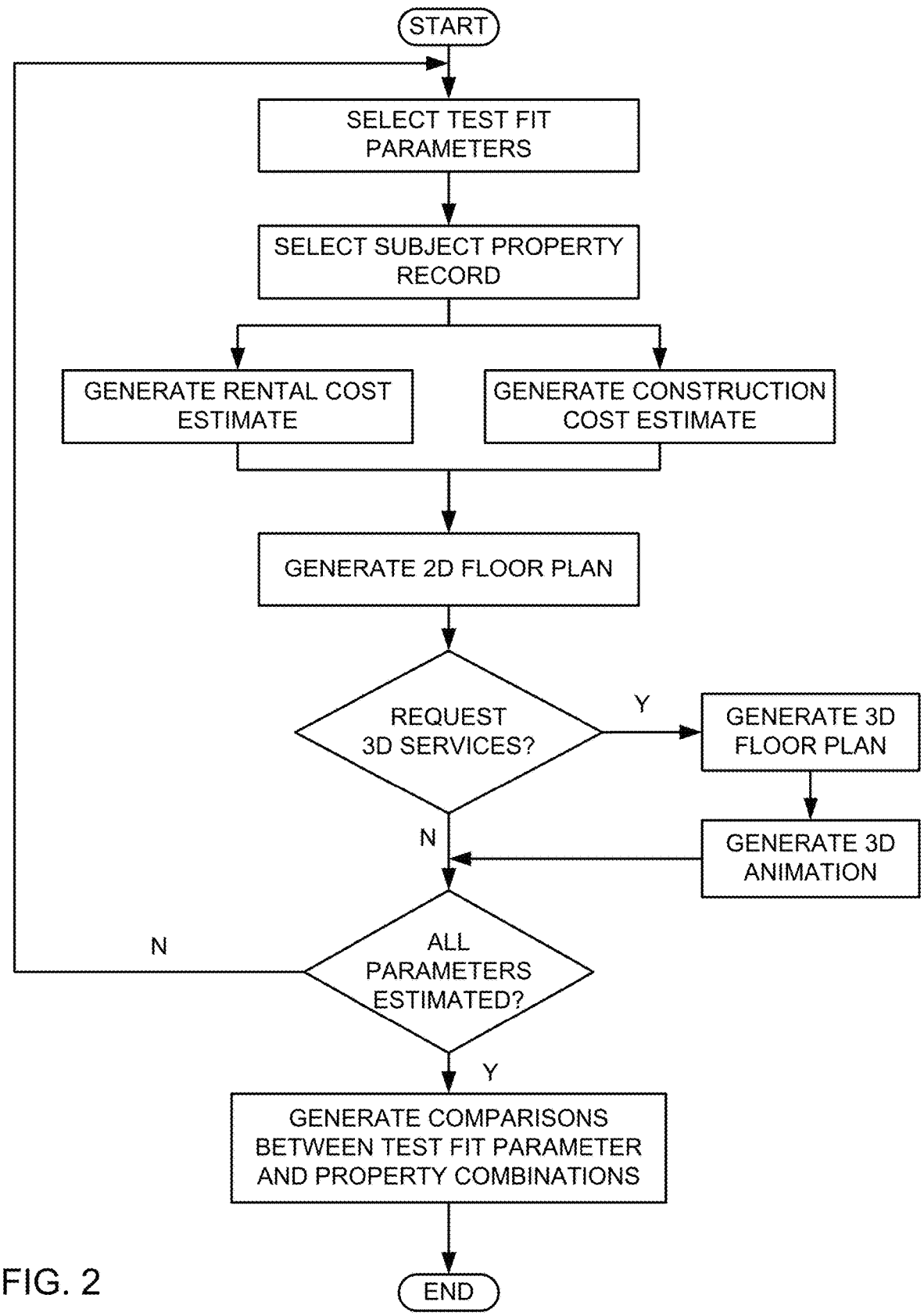
FIG. 2 is a flow chart illustrating one example of method steps executed in accordance with the present disclosure.
Figure 3:
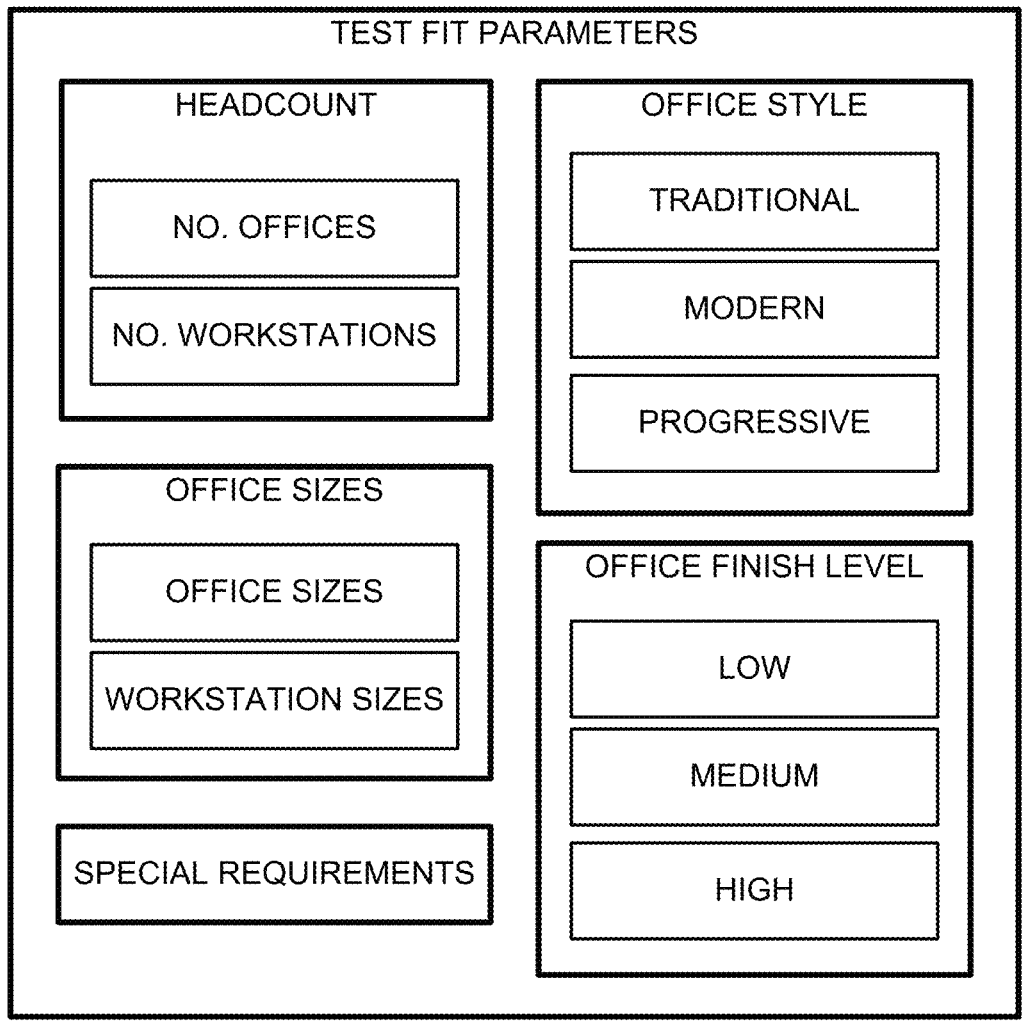
FIG. 3 is a block diagram illustrating an example of test-fit parameters in accordance with the present disclosure.
Figure 4:
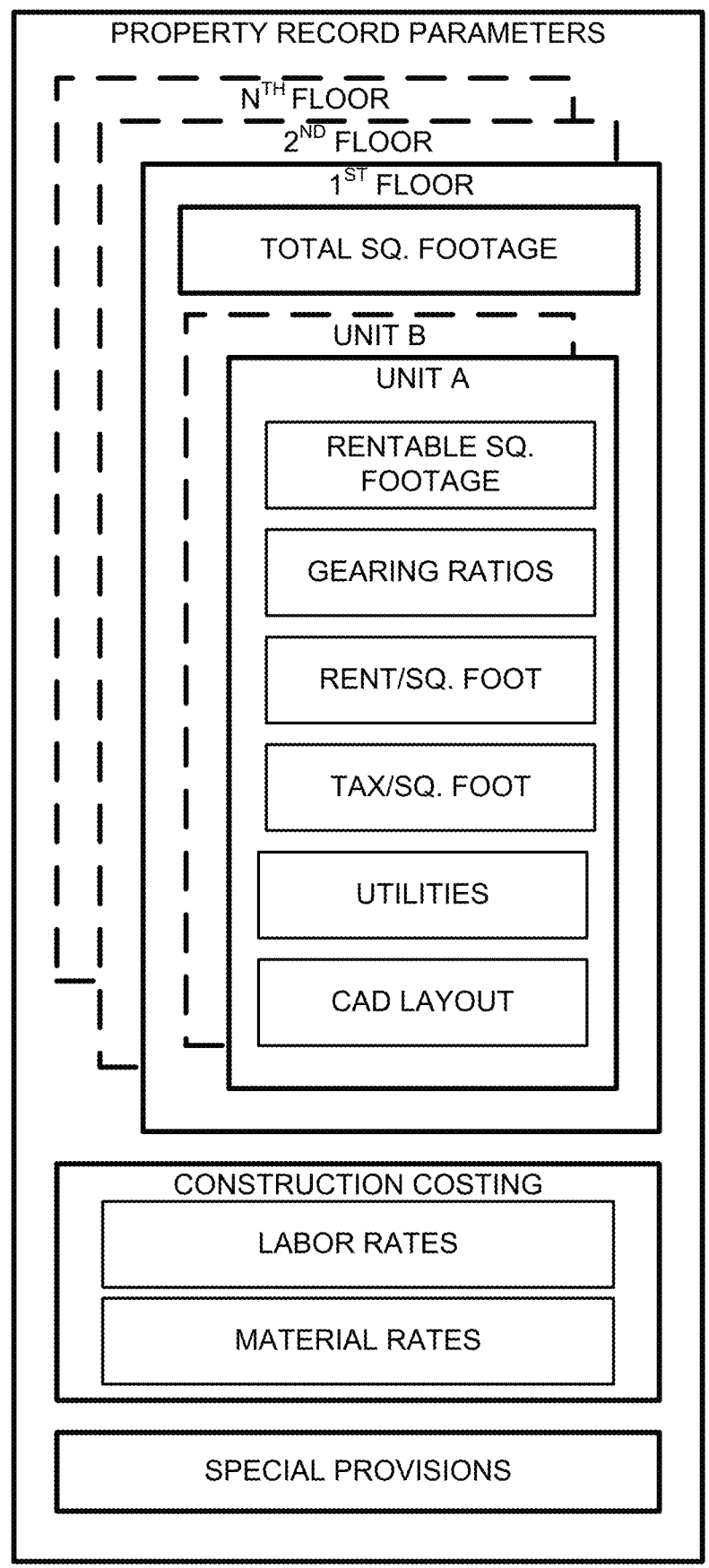
FIG. 4 is a block diagram illustrating an example of property record parameters in accordance with the present disclosure.

FIG. 2 is a flow chart illustrating steps in one example real estate fit and budgeting method. A user selects a number of test fit parameters based on a client's needs for a particular application. The test fit parameters will be used in conjunction with a property record to generate a test fit and budget for the client's application in relation to a particular property. An example set of test fit parameters is illustrated in FIG. 3, discussed below. The user then selects a subject property record. An example subject property record is illustrated in FIG. 4, discussed below.

Figure 6:
FIG. 6 is an example construction cost estimate generated by the estimating tool in accordance with the present disclosure.

Based on the test fit parameters and the property record, a leasing cost estimate and a construction cost estimate are generated. FIG. 6 illustrates an example of a construction budget estimate. These estimates may be generated independently or sequentially.

Figure 7:
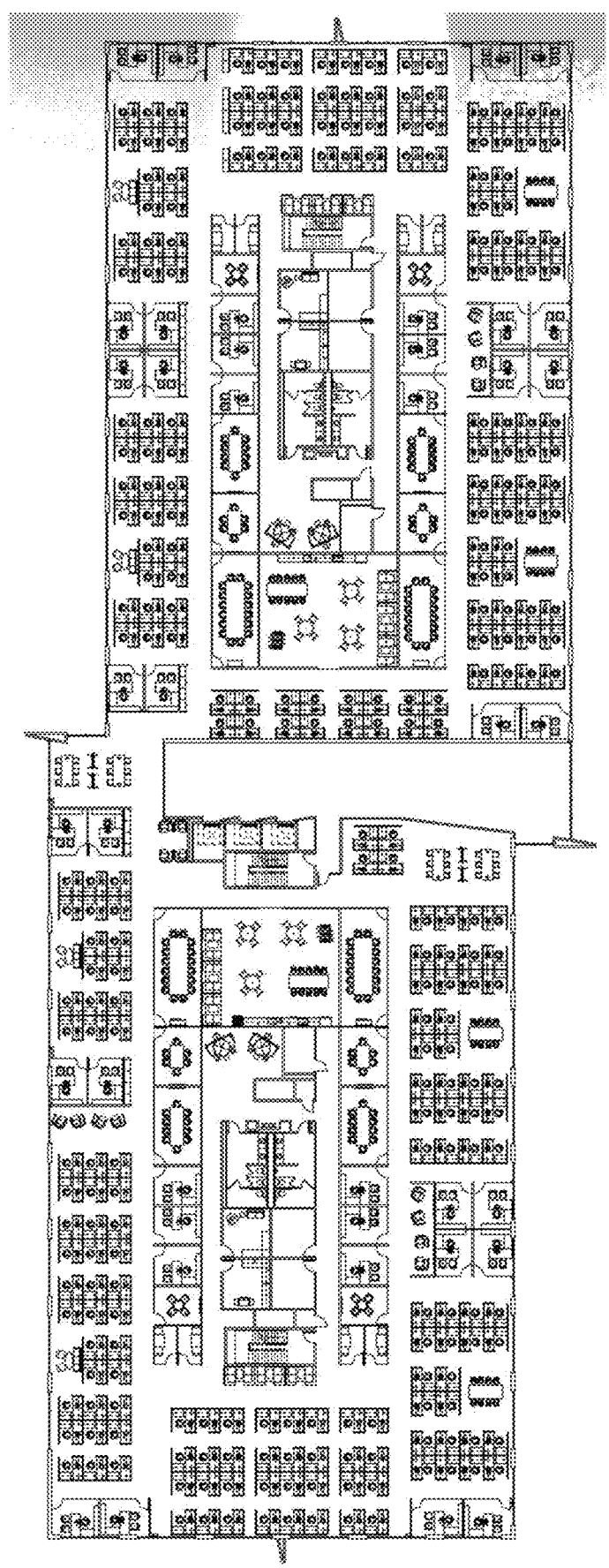
FIG. 7 is an example illustration of a test-fit floor plan displayed by the test-fit and budgeting tool in accordance with the present disclosure.

A two-dimensional (2D) Computer-Assisted Drafting (CAD) floor plan is then generated illustrating a proposed layout for the test fit parameters within the subject property. An example layout is illustrated in FIG. 7. In some examples, a client may request three-dimensional (3D) services. For example, a client may request a 3D CAD model of the proposed layout and/or a 3D animation of a "walkthough," i.e., a first-person view that a client would experience walking through the finished space.

In some examples, a client may want to apply a particular set of test-fit parameters to multiple properties, or apply multiple sets of test-fit parameters to a particular property, or both. If additional estimates are required, the process startsover. If all of the desired estimates and CAD products have been generated, a comparison of the estimates is generated. In one example, leasing estimates are displayed side-by side. In another example, construction estimates are displayed side-by-side. In another example, 2D floor plans are displayed side-by-side. In another example, a combination of leasing estimates, construction estimates, and floor plans is displayed. In another example, a user can select an estimate or a floor plan using a user-interface and a more detailed version of that estimate or floor plan will be displayed.

FIG. 3 illustrates an example set of test fit parameters which can be selected. The test fit parameters define a client's needs for a particular application. In this example, the parameters are divided in to office style, headcount, office sizes, and special requirements. Office styles determine how densely the subject property will be used by the client's application. For example, office styles may include options for traditional, modern, and progressive office styles. A traditional office style may include a higher ratio of single-user workspace (e.g. enclosed offices and cubicles) to common space. A progressive office style may include a lower ratio of single-user workspaces in favor of more common space (e.g. workbenches, common areas, conference/collaboration rooms). A modern office style may be in-between the traditional and progressive styles in terms of application density. In this example, a progressive office style would require fewer square feet per worker (greater application density), potentially saving the client money on leasing and construction expense in exchange for a lessformal office space. For this reason, 2D and 3D CAD layouts and walk-throughs provided with the cost estimates help the client to weigh costs versus the desired atmosphere desired for the application. Although the above example uses "office" styles, other examples could apply styles to any real estate applications, for example: manufacturing, warehousing, retail locations, professional/medical offices, etc.

Figure 5:
FIG. 5 is an illustration of an example user interface for selecting test-fit parameters related to property requirements in accordance with the present disclosure.
Figure 5:
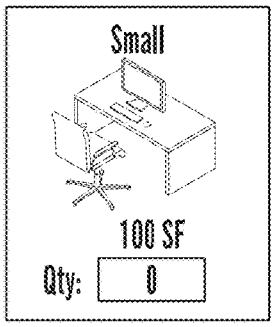
Figure 5:
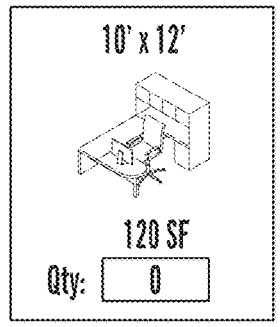
Figure 5:
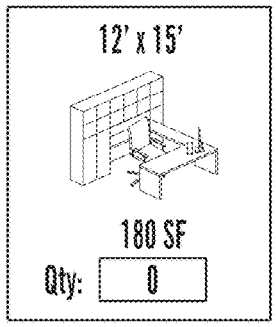
Figure 5:
Figure 5:
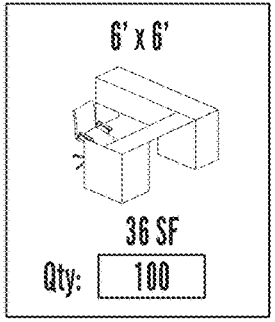
Figure 5:
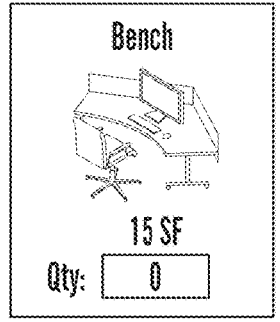
Figure 5:
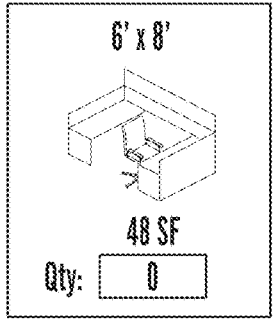
Figure 5:
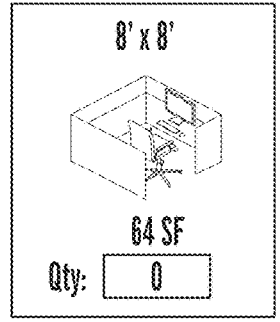
Figure 5:

The test fit parameters may also define the number of workers or workspaces the client needs to accommodate in the proposed application (i.e. "headcount"). Headcount may be further divided in to particular types of workspaces (e.g. enclosed offices, cubicles, work benches, etc.) The headcount may also include specialized workspaces, such as reception areas. Headcount parameters and the office style may also be specified cooperatively. For example, a client may specify a total headcount and a minimum number of enclosed offices, and allow the remainder of the headcount to be allocated automatically based on the office style. In another example, the test fit parameters may also specify dimensions of some or all of the workspaces (e.g. enclosed offices, cubicles. etc.) to be included in the application. In some examples, the test fit parameters may also define special requirements, such as particular common spaces (e.g. kitchens, conference rooms, storage, etc.). FIG. 5 illustrates one example of a user interface which may be used to select test fit parameters.

FIG. 4 illustrates elements of an example property record. A property record defines parameters limiting applications (e.g. available space) and parameters affecting client leasing and construction costs for a particular property. Properties may be sub-divided, in which case a property sub-record would exist for each current subdivision (e.g. floor) of a property and sub-sub-divisions (e.g. individual units on each floor). Some property record parameters may apply to an entire property, for example local labor and material rates for construction projects. Special provisions, such as building common areas, may also apply to an entire property.

Parameters for individual units may include the space available for lease, gearing rations (e.g. ratios of useable space to total space, facilities requirements per square foot, etc.), leasing cost per square foot, estimated tax expense per square foot, estimated utilities cost (either per unit or per square foot), and a CAD layout of the available unit. Similar parameters may also be available for an entire floor or sub-division, if appropriate.

The design and functionality described in this application is intended to be exemplary in nature and is not intended to limit the instant disclosure in any way. Those having ordinary skill in the art will appreciate that the teachings of the disclosure may be implemented in a variety of suitable forms, including those forms disclosed herein and additional forms known to those having ordinary skill in the art. For example, one skilled in the art will recognize that executable instructions may be stored on a non-transient, computer-readable storage medium, such that when executed by one or more processors, causes the one or more processors to implement the method described above.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Certain embodiments of this technology are described above with reference to block and flow diagrams of computing devices and methods and/or computer program products according to example embodiments of the disclosure. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the disclosure.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks.

As an example, embodiments of this disclosure may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While certain embodiments of this disclosure have been described in connection with what is presently considered to be the most practical and various embodiments, it is to be understood that this disclosure is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the technology and also to enable any person skilled in the art to practice certain embodiments of this technology, including making and using any apparatuses or systems and performing any incorporated methods. The patentable scope of certain embodiments of the technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system for estimating space and budgeting requirements for real estate applications, comprising:
   a processor; and
   a memory coupled to the processor which is configured to be capable of executing programmed instructions comprising and stored in the memory to:
   provide remote access to a client device over a network to receive real estate space and budgeting estimate in real time through a graphical user interface;
   transmit a plurality of test fit parameters for display in the graphical user interface on a display screen of the client device for selection;
   receive, via the graphical user interface, a first user input selection of test fit parameters, wherein one of the selected test fit parameters comprises one of a plurality of overall office layout styles for all of a subject property which each have a different overall ratio of single-user workspace to common space for all of the subject property;

receive, via the graphical user interface, a second user input selection of one or more property records each of the subject property, wherein each of the one or more property records includes parameters on at least one of the following: floors, units on each floor, space available for lease, gearing ratios, leasing cost per square foot, estimated tax expense per square foot, estimated utilities cost, or a CAD layout of each available unit;

automatically generate a leasing cost estimate and a construction cost estimate based on the selected test fit parameters for each of the one or more property records;

automatically generate a proposed layout of a floor plan based on the selected test fit parameters for each of the one or more property records; and transmit a comparison between a combination of two or more of the generated leasing cost estimate, the generated construction cost estimate, or the generated proposed layout of the floor plan of the one or more of the property records for display in the graphical user interface of the client device.

2. The system of claim 1, wherein the proposed layout of the floor plan includes at least one of the following: a two-dimensional computer-assisted drafting (CAD) floor plan, a three-dimensional CAD floor plan, or a three-dimensional animation of a walk-through floor plan.

3. The system of claim 1, wherein the test fit parameters define needs for an application of the subject property.

4. The system of claim 3, wherein the test fit parameters include at least one of the following information: office style, headcount, office sizes, manufacturing style, warehousing style, retail locations, professional office, medical office, and dimensions of workspaces, requirements for common spaces, or office finish level.

5. The system of claim 4, wherein the office style determines how densely the subject property is used by the application.

6. The system of claim 4, wherein the office styles include at least one of the following: traditional, modern or progressive office styles.

7. The system of claim 6, wherein the traditional office style includes a first ratio of single-user workspace to common space, the progressive office style includes a second ratio of single-use workspace to common space, and the modern office style includes a third ratio of single-user work space to common space, wherein the first ratio is greater than the second ratio, and the third ratio falls between the first ratio and the second ratio.

8. The system of claim 4, wherein the headcount includes at least one of the following: number of workers or number of workspaces.

9. The system of claim 8, wherein the processor is configured to:
receive a total headcount and a minimum number of enclosed offices from the client device; and
automatically allocate remaining of the total headcount based on a received selection of the office style.

10. The system of claim 1, wherein the property record defines parameters limiting the application of the subject property.

11. The system of claim 1, wherein the property record includes parameters on at least one of the following: floors or units on each floor.

12. The system of claim 1, wherein the parameters of the property record include space available for lease, gearing ratios, leasing cost per square foot, estimated tax expense per square foot, estimated utilities cost, and a CAD layout of each available unit.

13. The system of claim 1, wherein the processor is configured to:
receive a selection made in the graphical user interface of one of the following: the generated leasing cost estimate, the generated construction cost estimate, or the generated proposed layout of the floor plan, and
automatically transmit a detailed version of the selection for display in the graphical user interface.

14. A non-transitory computer readable medium having stored thereon instructions comprising executable code which when executed by at least one processor, cause the processor to:
provide remote access to a client device over a network to receive real estate space and budgeting estimate in real time through a graphical user interface;
transmit a plurality of test fit parameters for display in the graphical user interface on a display screen of the client device for selection;
receive, via the graphical user interface, a first user input selection of test fit parameters, wherein one of the selected test fit parameters comprises one of a plurality of overall office layout styles for all of a subject property which each have a different overall ratio of single-user workspace to common space for all of the subject property;
receive, via the graphical user interface, a second user input selection of one or more property records each of the subject property, wherein each of the one or more property records includes parameters on at least one of the following: floors, units on each floor, space available for lease, gearing ratios, leasing cost per square foot, estimated tax expense per square foot, estimated utilities cost, or a CAD layout of each available unit;
automatically generate a leasing cost estimate and a construction cost estimate based on the selected test fit parameters for each of the one or more property records;
automatically generate a proposed layout of a floor plan based on the selected test fit parameters for each of the one or more property records; and
transmit a comparison between a combination of two or more of the generated leasing cost estimate, the generated construction cost estimate, or the generated proposed layout of the floor plan of the one or more of the property records for display in the graphical user interface of the client device.

15. The non-transitory computer readable medium of claim 14, wherein the proposed layout of the floor plan includes at least one of the following: a two-dimensional computer-assisted drafting (CAD) floor plan, a three-dimensional CAD floor plan, or a three-dimensional animation of a walk-through floor plan.

16. The non-transitory computer readable medium of claim 14, wherein the test fit parameters define needs for an application of the subject property.

17. The non-transitory computer readable medium of claim 16, wherein the test fit parameters include at least one of the following information: office style, headcount, office sizes, manufacturing style, warehousing style, retail locations, professional office, medical office, and dimensions of workspaces, requirements for common spaces, or office finish level.

18. The non-transitory computer readable medium of claim 17, wherein the office style determines how densely the subject property is used by the application.

19. The non-transitory computer readable medium of claim 17, wherein the office styles include at least one of the following: traditional, modern or progressive office styles.

20. The non-transitory computer readable medium of claim 19, wherein the traditional office style includes a first ratio of single-user workspace to common space, the progressive office style includes a second ratio of single-use workspace to common space, and the modern office style includes a third ratio of single-user work space to common space, wherein the first ratio is greater than the second ratio, and the third ratio falls between the first ratio and the second ratio.

21. The non-transitory computer readable medium of claim 17, wherein the headcount includes at least one of the following: number of workers or number of workspaces.

22. The non-transitory computer readable medium of claim 21, wherein the processor is configured to:
receive a total headcount and a minimum number of enclosed offices from the client device; and
automatically allocate remaining of the total headcount based on a received selection of the office style.

23. The non-transitory computer readable medium of claim 14, wherein the property record defines parameters limiting the application of the subject property.

24. The non-transitory computer readable medium of claim 14, wherein the property record includes parameters on at least one of the following: floors or units on each floor.

25. The non-transitory computer readable medium of claim 14, wherein the parameters of the property record include space available for lease, gearing ratios, leasing cost per square foot, estimated tax expense per square foot, estimated utilities cost, and a CAD layout of each available unit.

26. The non-transitory computer readable medium of claim 14, wherein the processor is configured to:
receive a selection made in the graphical user interface of one of the following: the generated leasing cost estimate, the generated construction cost estimate, or the generated proposed layout of the floor plan, and automatically transmit a detailed version of the selection for display in the graphical user interface.

27. A method comprising:
providing, by a computing device, remote access to a client device over a network to receive real estate space and budgeting estimate in real time through a graphical user interface;
transmitting, by the computing device, a plurality of test fit parameters for display in the graphical user interface on a display screen of the client device for selection;
receiving, by the computing device, via the graphical user interface a first user input selection of test fit parameters, wherein one of the selected test fit parameters comprises one of a plurality of overall office layout styles for all of a subject property which each have a different overall ratio of single-user workspace to common space for all of the subject property;
receiving, by the computing device, via the graphical user interface a second user input selection of one or more property records each of the subject property, wherein each of the one or more property records includes parameters on at least one of the following: floors, units on each floor, space available for lease, gearing ratios, leasing cost per square foot, estimated tax expense per square foot, estimated utilities cost, or a CAD layout of each available unit;
automatically generating, by the computing device, a leasing cost estimate and a construction cost estimate based on the selected test fit parameters for each of the one or more property records;
automatically generating, by the computing device, a proposed layout of a floor plan based on the selected test fit parameters for each of the one or more property records; and
transmitting, by the computing device, a comparison between a combination of two or more of the generated leasing cost estimate, the generated construction cost estimate, or the generated proposed layout of the floor plan of the one or more of the property records for display in the graphical user interface of the client device.

28. The method of claim 27, wherein the proposed layout of the floor plan includes at least one of the following: a two-dimensional computer-assisted drafting (CAD) floor plan, a three-dimensional CAD floor plan, or a three-dimensional animation of a walk-through floor plan.

29. The method of claim 27, wherein the test fit parameters define needs for an application of the subject property.

30. The method of claim 29, wherein the test fit parameters include at least one of the following information: office style, headcount, office sizes, manufacturing style, warehousing style, retail locations, professional office, medical office, and dimensions of workspaces, requirements for common spaces, or office finish level.

31. The method of claim 30, wherein the office style determines how densely the subject property is used by the application.

32. The method of claim 30, wherein the office styles include at least one of the following: traditional, modern or progressive office styles.

33. The method of claim 32, wherein the traditional office style includes a first ratio of single-user workspace to common space, the progressive office style includes a second ratio of single-use workspace to common space, and the modern office style includes a third ratio of single-user work space to common space, wherein the first ratio is greater than the second ratio, and the third ratio falls between the first ratio and the second ratio.

34. The method of claim 30, wherein the headcount includes at least one of the following: number of workers or number of workspaces.

35. The method of claim 34, further comprising:
receiving, by the computing device, a total headcount and a minimum number of enclosed offices from the client device; and
automatically allocating, by the computing device, remaining of the total headcount based on a received selection of the office style.

36. The method of claim 27, wherein the property record defines parameters limiting the application of the subject property.

37. The method of claim 27, wherein the property record includes parameters on at least one of the following: floors or units on each floor.

38. The method of claim 27, wherein the parameters of the property record include space available for lease, gearing ratios, leasing cost per square foot, estimated tax expense per square foot, estimated utilities cost, and a CAD layout of each available unit.

39. The method of claim 27, further comprising:
receiving, by the computing device, a selection made in the graphical user interface of one of the following: the generated leasing cost estimate, the generated construction cost estimate, or the generated proposed layout of the floor plan, and
automatically transmitting, by the computing device, a detailed version of the selection for display in the graphical user interface.

\* \* \* \* \*